United States Patent
Jung et al.

(10) Patent No.: US 9,391,167 B1
(45) Date of Patent: Jul. 12, 2016

(54) METHOD FOR MANUFACTURING SEMICONDUCTOR DEVICE

(71) Applicant: Hyundai Motor Company, Seoul (KR)

(72) Inventors: Youngkyun Jung, Seoul (KR); Junghee Park, Gyeonggi-do (KR); Dae Hwan Chun, Gyeonggi-do (KR); JongSeok Lee, Gyeonggi-do (KR)

(73) Assignee: Hyundai Motor Company, Seoul (KR)

( * ) Notice: Subject to any disclaimer, the term of this patent is extended or adjusted under 35 U.S.C. 154(b) by 0 days.

(21) Appl. No.: 14/944,950

(22) Filed: Nov. 18, 2015

(30) Foreign Application Priority Data

Sep. 2, 2015 (KR) .................. 10-2015-0124459

(51) Int. Cl.
*H01L 21/336* (2006.01)
*H01L 29/66* (2006.01)
*H01L 29/16* (2006.01)
H01L 29/417 (2006.01)

(52) U.S. Cl.
CPC ...... *H01L 29/66734* (2013.01); *H01L 29/1608* (2013.01); *H01L 29/41766* (2013.01)

(58) Field of Classification Search
None
See application file for complete search history.

(56) References Cited

U.S. PATENT DOCUMENTS

| | | | | |
|---|---|---|---|---|
| 5,719,409 | A * | 2/1998 | Singh | H01L 29/1095 257/328 |
| 2006/0076613 | A1* | 4/2006 | Ohyanagi | H01L 29/1066 257/330 |
| 2010/0176443 | A1* | 7/2010 | Takaishi | H01L 29/7828 257/328 |
| 2013/0306983 | A1* | 11/2013 | Nakano | H01L 29/0623 257/76 |

FOREIGN PATENT DOCUMENTS

| | | |
|---|---|---|
| JP | 2010-045245 A | 2/2010 |
| KR | 10-1051158 B1 | 7/2011 |
| KR | 2014-0056971 A | 5/2014 |

* cited by examiner

*Primary Examiner* — Angel Roman
(74) *Attorney, Agent, or Firm* — Mintz Levin Cohn Ferris Glovsky and Popeo, P.C.; Peter F. Corless

(57) ABSTRACT

A method for manufacturing a semiconductor device includes: forming sequentially an n− type epitaxial layer and an n+ type area on a first surface of an n+ type silicon carbide substrate; forming a plurality of first trenches and a plurality of second trenches by etching the n− type epitaxial layer and the n+ type area using a first mask pattern as a mask after forming the first mask pattern on the n+ type area; forming a groove by etching the first mask pattern using a first photosensitive film pattern as a mask after forming the first photosensitive film pattern in the plurality of first trenches; forming a p type area by injecting p ions in the plurality of second trenches using the first mask pattern with the groove as the mask after removing the first photosensitive film pattern; forming a gate insulating layer in the plurality of first trenches after removing the first mask pattern with the groove; forming a gate electrode on the gate insulating layer; forming a passivation layer on the gate electrode; forming a source electrode in the plurality of second trenches; and forming a drain electrode on a second surface which is an opposite side to the first surface of the n+ type silicon carbide substrate.

14 Claims, 17 Drawing Sheets

METHOD FOR MANUFACTURING SEMICONDUCTOR DEVICE

CROSS-REFERENCE TO RELATED APPLICATION

This application claims priority to and the benefit of Korean Patent Application No. 10-2015-0124459 filed in the Korean Intellectual Property Office on Sep. 2, 2015, wherein the entire contents of which are incorporated herein by reference.

BACKGROUND (a) Technical Field

The present disclosure relates generally to a method for manufacturing a semiconductor device and, more particularly, to manufacturing a semiconductor device in which an accumulation layer is formed on a side wall of a trench by accurately injecting ions in a silicon carbide MOSFET to which a trench gate is applied.

(b) Description of the Related Art

Recently, semiconductor devices have been designed to enable power having high breakdown voltage, high current, and high switching characteristics in order to satisfy larger application apparatuses. In such semiconductor devices, while very large current flows, low on-resistance or low saturation voltage is required in order to decrease power loss in a conducting state. Further, resistance to inverse high voltage of an PN junction, which is applied to both ends of the power semiconductor device in an off state or at the moment when a switch is off, i.e., high-breakdown voltage, is required.

A metal oxide semiconductor field effect transistor (MOSFET) in a semiconductor device is the most general field effect transistor in a digital circuit and an analog circuit. Meanwhile, in order to reduce the on-resistance and increase the current density, a trench gate MOSFET formed by removing a junction field effect transistor (JFET) area of a planar gate MOSFET has been researched.

In a trench gate MOSFET, after a trench is formed, ions are injected into the side wall of the trench to form an accumulation layer. In this case, a gate unit and a source unit need to be separated from each other, and at this time, an alignment error is generated. Thus, there is a problem in that the ions are not accurately injected.

The above information disclosed in this Background section is only for enhancement of understanding of the background of the disclosure, and therefore, it may contain information that does not form the related art that is already known in this country to a person of ordinary skill in the art.

SUMMARY

The present disclosure has been made in an effort to provide a method for manufacturing a semiconductor device having advantages of forming an accumulation layer on a side wall of a trench by accurately injecting ions in a silicon carbide MOSFET to which a trench gate is applied.

Embodiments of the present disclosure provide a method for manufacturing a semiconductor device including: forming sequentially an n− type epitaxial layer and an n+ type area on a first surface of an n+ type silicon carbide substrate; forming a plurality of first trenches and a plurality of second trenches by etching the n− type epitaxial layer and the n+ type area using a first mask pattern as a mask after forming the first mask pattern on the n+ type area; forming a groove by etching the first mask pattern using a first photosensitive film pattern as a mask after forming the first photosensitive film pattern in the plurality of first trenches; forming a p type area by injecting p ions in the plurality of second trenches using the first mask pattern with the groove as the mask after removing the first photosensitive film pattern; forming a gate insulating layer in the plurality of first trenches after removing the first mask pattern with the groove; forming a gate electrode on the gate insulating layer; forming a passivation layer on the gate electrode; forming a source electrode in the plurality of second trenches; and forming a drain electrode on a second surface which is an opposite side to the first surface of the n+ type silicon carbide substrate.

In the forming of the p type area, the p ions may be injected into a part of the side of each second trench, and the p ions may be injected into the part of the side of each second trench in an oblique direction.

The p type area may be formed on the side of each second trench.

A part of the first photosensitive film pattern may be formed on the first mask pattern adjacent to a first trench of the plurality of first trenches.

The first mask pattern may be formed by an oxide film.

The forming of the gate insulating layer, the forming of the gate electrode, and the forming of the passivation layer may include: forming a second mask pattern exposing the plurality of first trenches and the plurality of second trenches on the n+ type area after removing the first mask pattern with the groove; forming a third mask pattern exposing a part of the n+ type area by etching the second mask pattern; forming a first insulating layer on the plurality of first trenches, the plurality of second trenches, the n+ type area, and the third mask pattern; forming the second insulating layer exposing the plurality of second trenches and the part of the n+ type area by etching the first insulating layer using a second photosensitive film pattern as a mask after forming the second photosensitive film pattern on the first insulating layer; forming a gate material layer on the plurality of second trenches, the n+ type area, and the second insulating layer after removing the second photosensitive film pattern; forming a third insulating layer on the gate material layer and the second insulating layer after removing a part of the gate material layer; exposing the plurality of second trenches by etching the third insulating layer, the gate material layer, and the second insulating layer using a third photosensitive film pattern as a mask after forming the third photosensitive film pattern on the third insulating layer and forming the gate electrode in the plurality of first trenches; and forming the gate insulating layer and the passivation layer by removing the third photosensitive film pattern and the third mask pattern.

The third mask pattern may be removed by an ashing process, and the second insulating layer and the third insulating layer formed on the third mask pattern may be removed when the third mask pattern is removed.

The third mask pattern may expose approximately 30% to approximately 50% of the entire surface of the n+ type area.

The first insulating layer may be formed to surround the third mask pattern.

In the forming of the second insulating layer, the plurality of second trenches and the n+ type area at a portion adjacent to a second trench of the plurality of second trenches may be exposed by etching the first insulating layer formed in the plurality of second trenches, the first insulating layer formed on the n+ type area at a portion adjacent to the second trench, and a part of the second photosensitive film pattern.

The third photosensitive film pattern may expose the third insulating layer formed at a portion corresponding to the plurality of second trenches, and an extended line of a side of the third photosensitive film pattern may coincide with an extended line of a side of the third mask pattern adjacent to the second trench.

The second mask pattern may be formed of amorphous carbon.

The first insulating layer and the third insulating layer may be formed of silicon oxide.

The gate material layer may be formed of polysilicon.

As such, according to embodiments of the present disclosure, it is possible to inject p ions onto a side of a second trench which is a desired place by injecting the p ions in an oblique direction by using a first mask pattern with a groove. Further, it is possible to solve a problem due to an alignment error when forming a gate electrode, a gate insulating layer, and a passivation layer by forming a second mask pattern on an n+ type area, forming the gate electrode after forming a third mask pattern exposing a part of the n+ type area by etching the second mask pattern, and forming the gate insulating layer and the passivation layer by removing a third mask pattern.

Figure 1:
FIGS. 1-17 are diagrams illustrating a method for manufacturing a semiconductor device according to embodiments of the present disclosure.

It should be understood that the above-referenced drawings are not necessarily to scale, presenting a somewhat simplified representation of various preferred features illustrative of the basic principles of the disclosure. The specific design features of the present disclosure, including, for example, specific dimensions, orientations, locations, and shapes, will be determined in part by the particular intended application and use environment.

DETAILED DESCRIPTION OF THE EMBODIMENTS

Hereinafter, embodiments of the present disclosure will be described in detail with reference to the accompanying drawings. As those skilled in the art would realize, the described embodiments may be modified in various different ways, all without departing from the spirit or scope of the present disclosure. On the contrary, embodiments introduced herein are provided to make disclosed contents thorough and complete and sufficiently transfer the spirit of the present disclosure to those skilled in the art.

In the drawings, the thickness of layers, films, panels, regions, etc., are exaggerated for clarity. It will be understood that when a layer is referred to as being "on" another layer or substrate, it can be directly on the other layer or substrate, or intervening them may also be present.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items.

Hereinafter, a method for manufacturing a semiconductor device according to embodiments of the present disclosure will be described with reference to FIGS. 1-17.

FIGS. 1-17 are diagrams illustrating a method for manufacturing a semiconductor device according to embodiments of the present disclosure.

Referring to FIG. 1, an n− type epitaxial layer 200 is formed on a first surface of an n+ type silicon carbide substrate 100. The n− type epitaxial layer 200 is formed by epitaxial growth.

Further, the n− type epitaxial layer 200 is not limited thereto, and may be formed by injecting n− ions into the first surface of the n+ type silicon carbide substrate 100.

Figure 2:
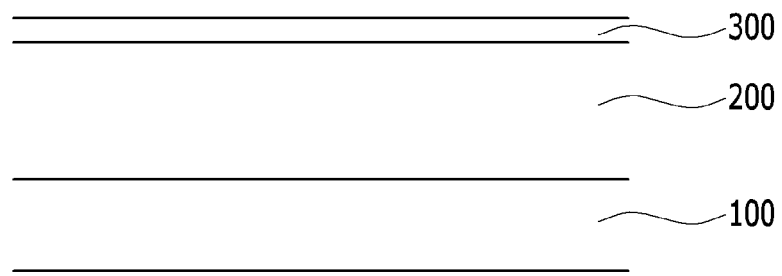

Referring to FIG. 2, an n+ type area 300 is formed on the n− type epitaxial layer 200. The n+ type area 300 is formed by injecting the ions. That is, the n+ type area 300 is formed by injecting the n+ ions into the surface of the n− type epitaxial layer 200.

Further, the n+ type area 300 is not limited thereto, and may also be formed on the n− type epitaxial layer 200 by the epitaxial growth.

Figure 3:
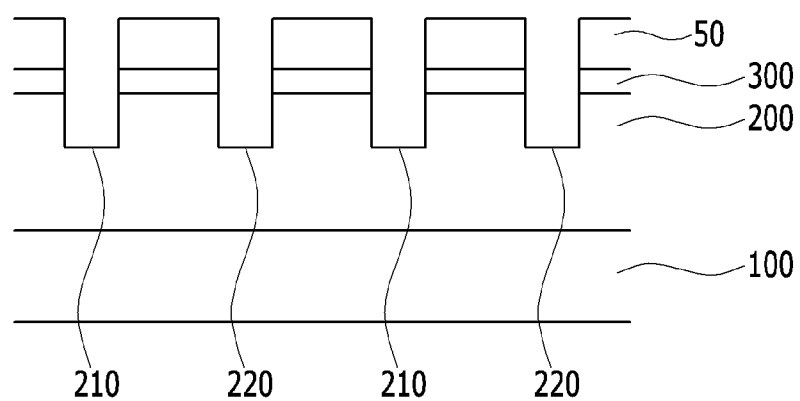

Referring to FIG. 3, after a first mask pattern 50 is formed on the n+ type area 300, a plurality of first trenches 210 and a plurality of second trenches 220 are formed by etching the n+ type area 300 and the n− type epitaxial layer 200 by using the first mask pattern 50 as a mask. The first mask pattern 50 exposes the first trenches 210 and second trenches 220 and may be formed by an oxide film.

The first trenches 210 and second trenches 220 pass through the n+ type area 300 and are formed on a part of the n− type epitaxial layer 200. The plurality of first trenches 210 and the plurality of second trenches 220 are alternately disposed, and a cross-sectional area and a depth of each first trench 210 are the same as a cross-sectional area and a depth of each second trench 220.

Figure 4:
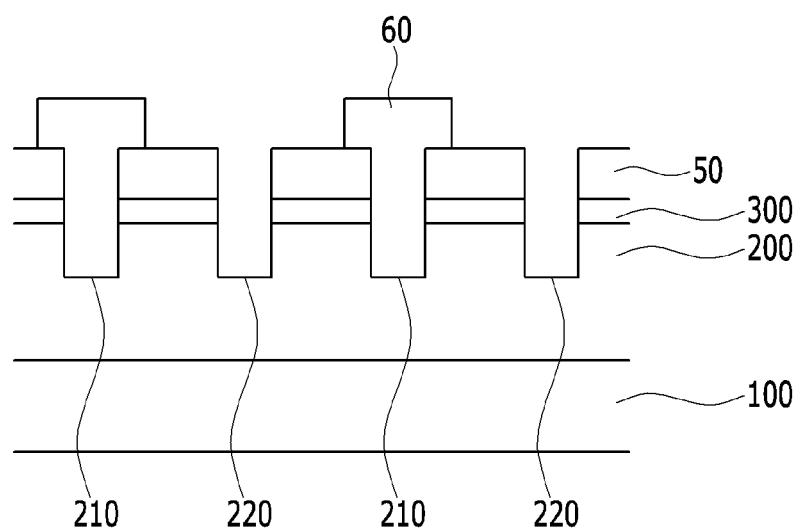

Referring to FIG. 4, a first photosensitive film pattern 60 is formed in the plurality of first trenches 210. The first photosensitive film pattern 60 fills each first trench 210, and a part of the first photosensitive film pattern 60 is positioned on the first mask pattern 50 adjacent to the first trench 210.

Figure 5:
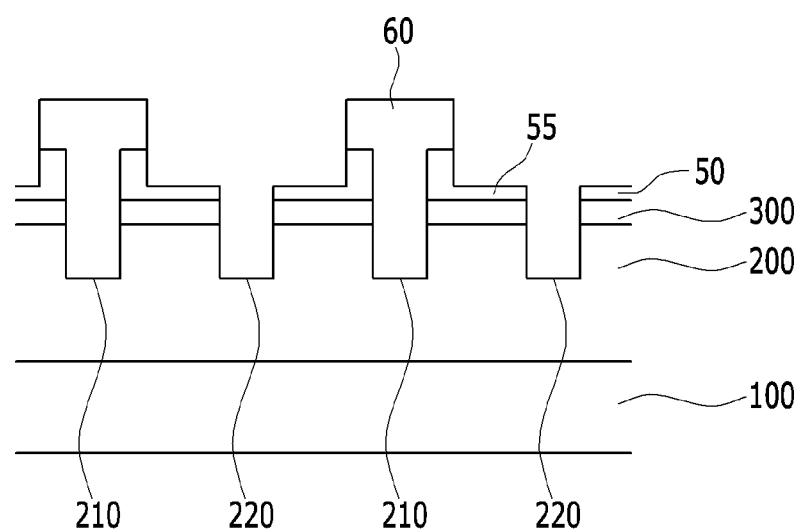

Referring to FIG. 5, a groove 55 is formed by etching the first mask pattern 50 by using the first photosensitive film pattern 60 as a mask. The groove 55 is formed on the first mask pattern 50. Here, when etching the first mask pattern 50, the n+ type area 300 and the n− type epitaxial layer 200 are not etched.

Figure 6:
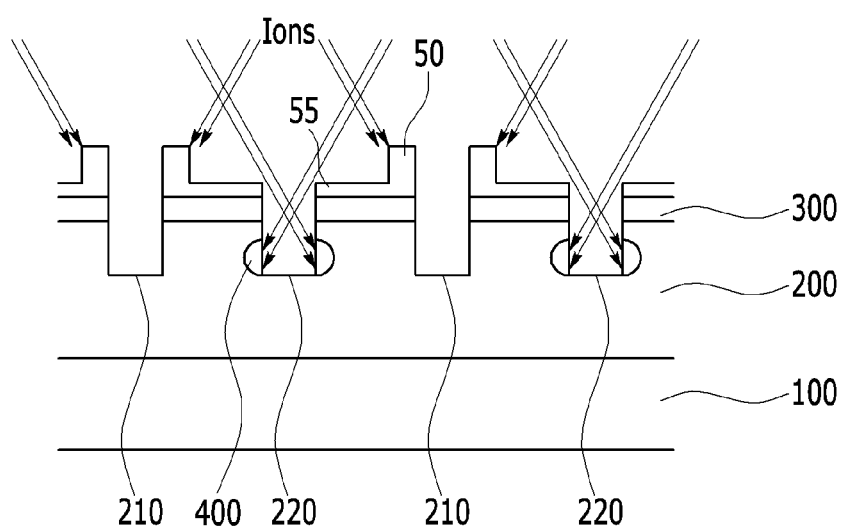

Referring to FIG. 6, after the first photosensitive film pattern 60 is removed, a p type area 400 is formed by injecting p ions in the second trenches 220 by using the first mask pattern 50 with the groove 55 as a mask.

In this case, the p ions are injected in an oblique direction. Since the p ions are injected in an oblique direction and the groove 55 is formed on the first mask pattern 50, the p ions are not injected into the first trench 210, but are injected into a part of the side of the second trench 220, that is, the side of the lower portion of the second trench 220. Accordingly, the p type area 400 is formed to contact the part of the side of the second trench 220.

Meanwhile, the first mask pattern 50 is formed so as to fill the first trench 210, and next, the p ions may be injected. In this case, it is difficult to remove the first mask pattern 50 formed in the first trench 210. Further, after the first trench 210 is filled with the first photosensitive film pattern 60 without forming the first mask pattern 50, the p ions may be injected. In this case, the p ions are injected into the first photosensitive film pattern 60 and thus, the p ions may be injected into the first trench 210.

However, in the embodiments of the present disclosure described herein, there is an advantage of injecting the p ions into the side of the second trench 220 which is a desired place, by injecting the p ions in the oblique direction by using the first mask pattern 50 with the groove 55 as the mask.

Figure 7:
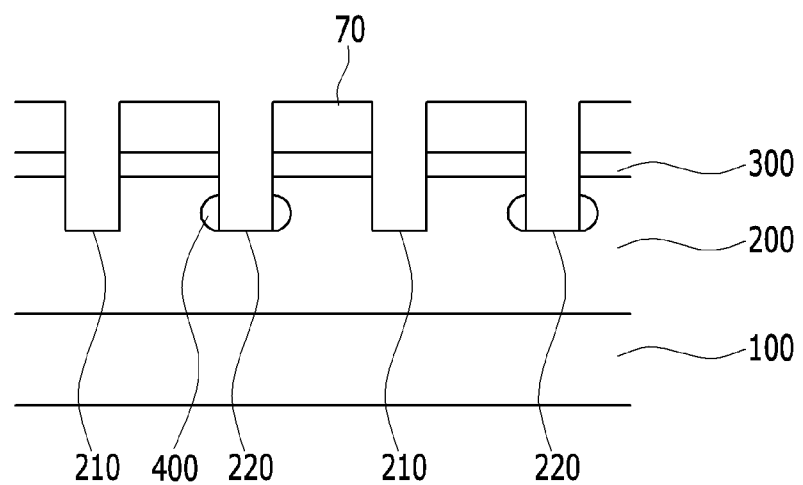
Figure 8:
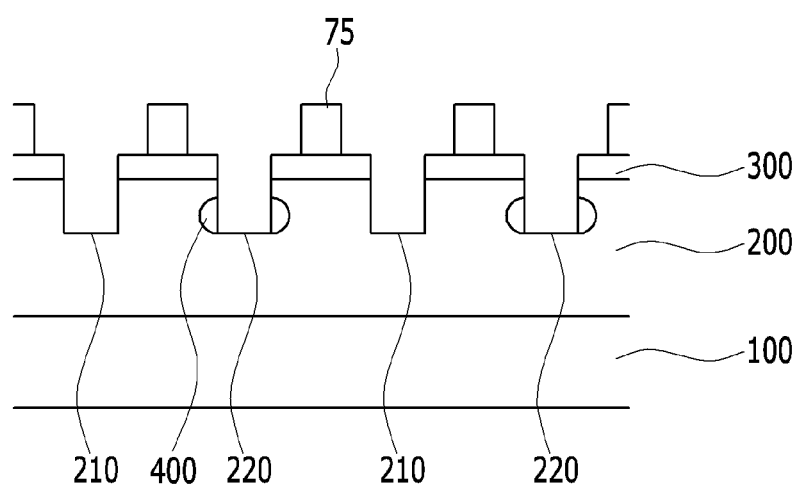

Referring to FIGS. 7 and 8, after the first mask pattern 50 with the groove 55 is removed, a second mask pattern 70 is formed on the n+ type area 300. Next, a third mask pattern 75 is formed by etching the second mask pattern 70.

The second mask pattern 70 and the third mask pattern 75 may be formed with amorphous carbon. The second mask pattern 70 exposes the first trenches 210 and the second trenches 220, and the third mask pattern 75 exposes a part of the n+ type area 300. The third mask pattern 75 may expose 30% to 50% of the entire surface of the n+ type area 300.

Figure 9:
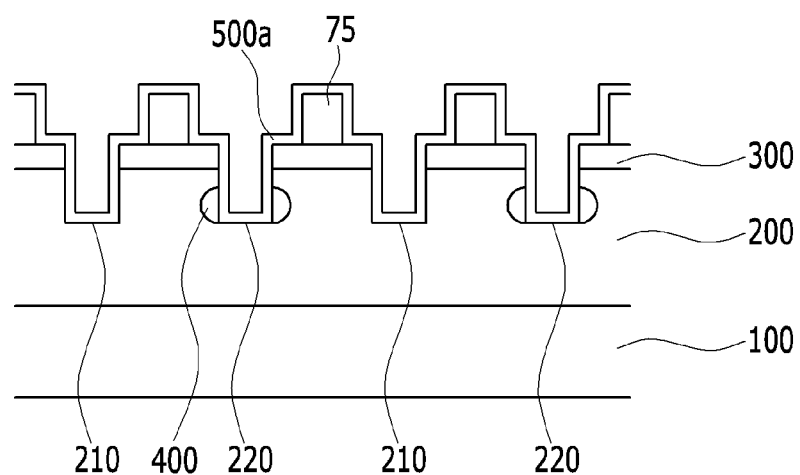

Referring to FIG. 9, a first insulating layer 500a is formed on the first trench 210, the second trench 220, the n+ type area 300, and the third mask pattern 75. The first insulating layer 500a may be formed to surround the third mask pattern 75. In this case, the first insulating layer 500a may be made of silicon oxide (SiOx) and a thickness of the first insulating layer 500a may be 100 nm to 300 nm.

Figure 10:
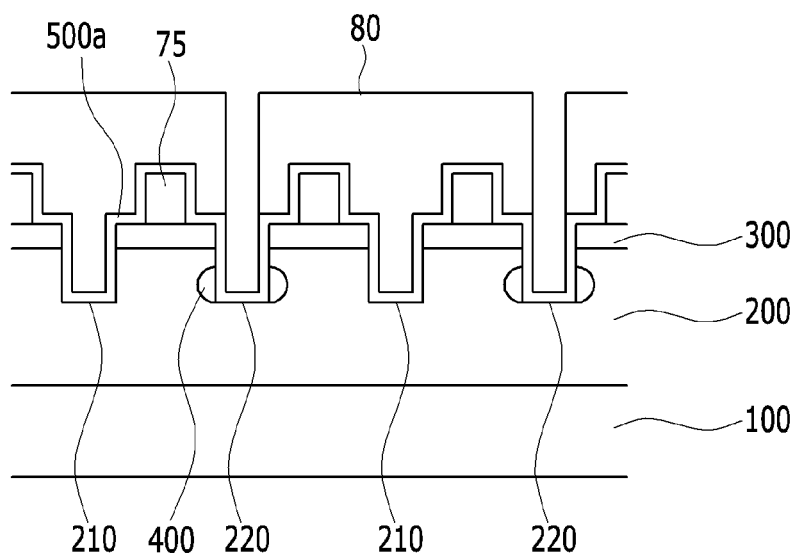

Referring to FIG. 10, a second photosensitive film pattern 80 is formed on the first insulating layer 500a. The second photosensitive film pattern 80 exposes the first insulating layer 500a formed in the second trench 220.

Figure 11:
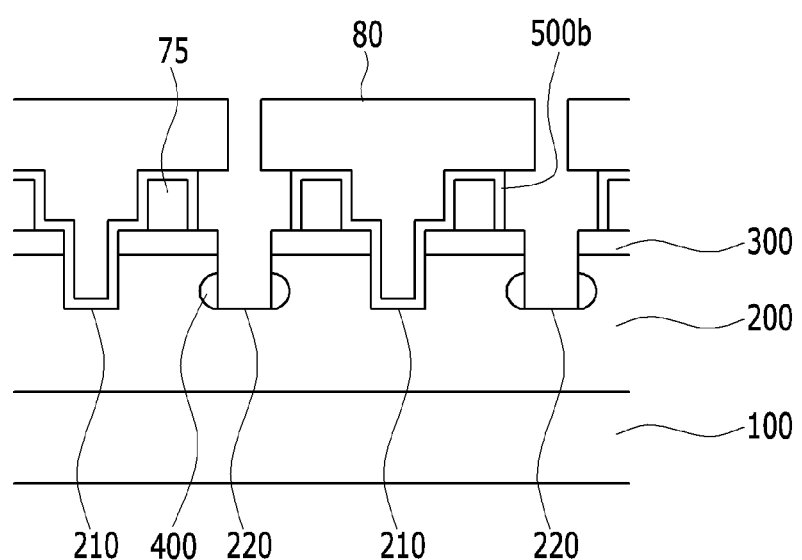

Referring to FIG. 11, a second insulating layer 500b is formed by etching the first insulating layer 500a by using the second photosensitive film pattern 80 as a mask. The etching is performed by wet etching, and the first insulating layer 500a formed in the second trench 220 is etched. Further, the first insulating layer 500a formed on the n+ type area 300 at a portion adjacent to the second trench 220 and a part of the second photosensitive film pattern 80 are etched. As a result, the n+ type area 300 at the portion adjacent to the second trench 220 is exposed.

Figure 12:
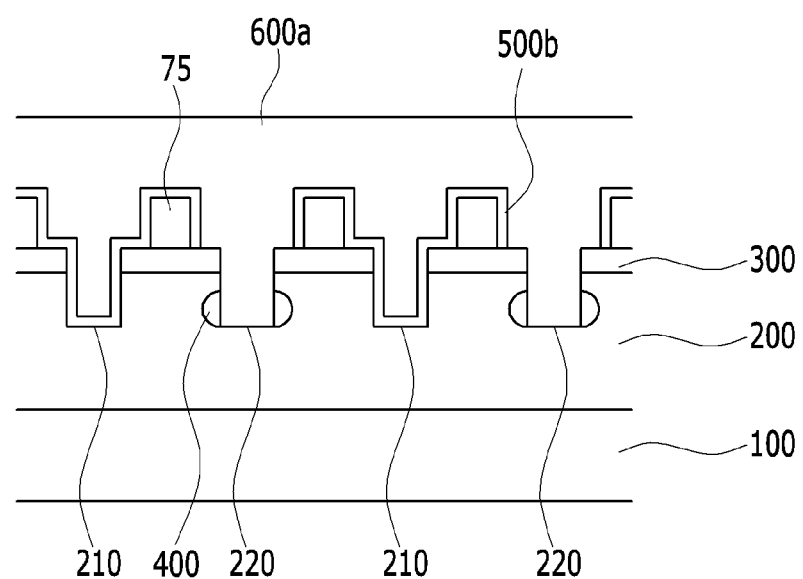
Figure 13:
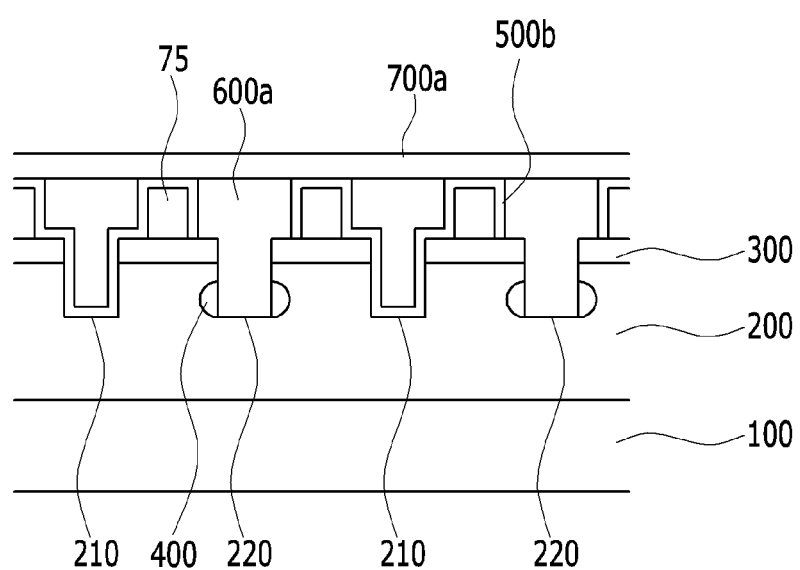

Referring to FIGS. 12 and 13, after the second photosensitive film pattern 80 is removed, a gate material layer 600a is formed on the second trench 220, the n+ type area 300, and the second insulating layer 500b. Next, after a part of the gate material layer 600a is removed so that the second insulating layer 500b is exposed, a third insulating layer 700a is formed on the gate material layer 600a and the second insulating layer 500b.

The gate material layer 600a may be made of polysilicon, and the third insulating layer 700a may be made of silicon oxide (SiOx). A thickness of the third insulating layer 700a may be 1 μm to 3 μm.

Figure 14:
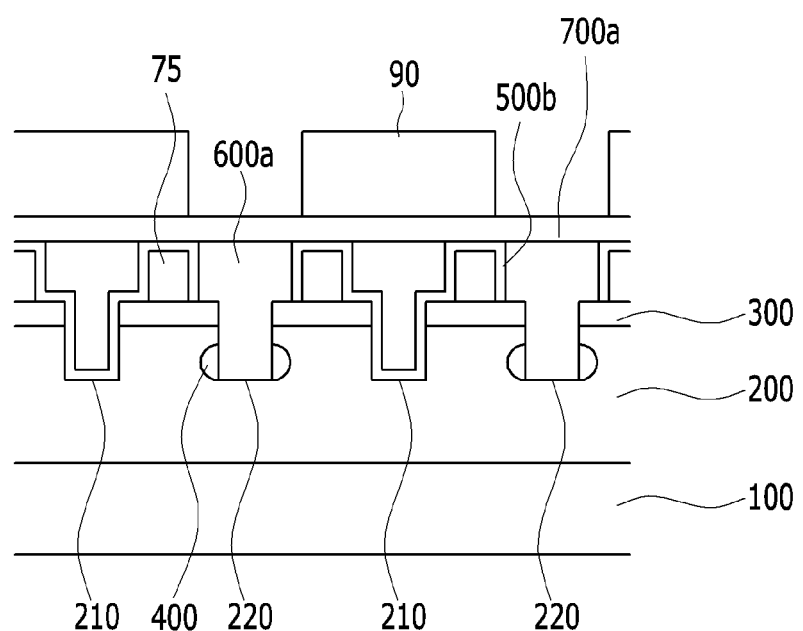

Referring to FIG. 14, a third photosensitive film pattern 90 is formed on the third insulating layer 700a. The third photosensitive film pattern 90 exposes the third insulating layer 700a positioned at the portion corresponding to the second trench 220. The third photosensitive film pattern 90 covers the first trenches 210, and an extended line of the side of the third photosensitive film pattern 90 may coincide with an extended line of the side of the third mask pattern 75 adjacent to the second trench 220.

Figure 15:
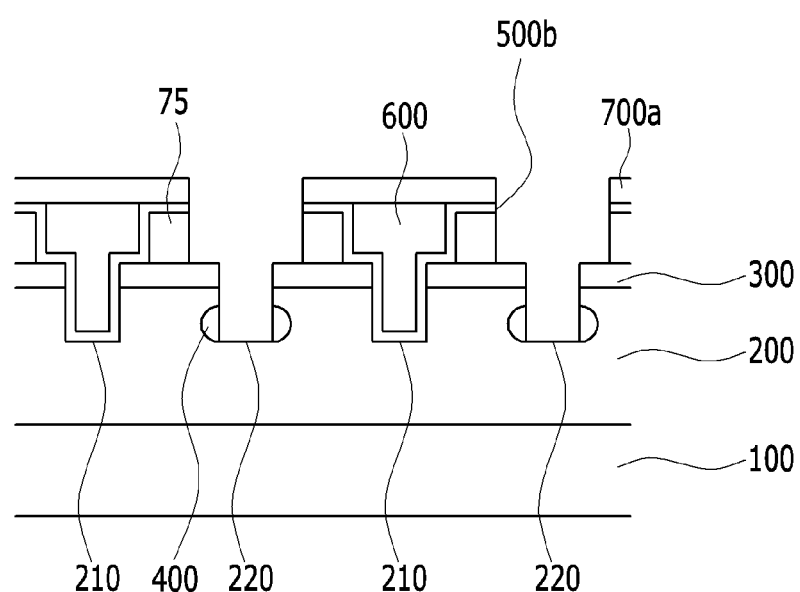

Referring to FIG. 15, the second trench 220 is exposed by etching the third insulating layer 700a, the gate material layer 600a, and the second insulating layer 500b by using the third photosensitive film pattern 90 as a mask. In this case, the gate material layer 600a positioned in the second trench 220 is etched, and the gate material layer positioned in the first trench 210 becomes the gate electrode 600. Further, the gate material layer 600a formed on the n+ type area 300 at the portion adjacent to the second trench 220 is etched and thus, the n+ type area 300 at the portion adjacent to the second trench 220 is exposed. Further, the second insulating layer 500b covering the side of the third mask pattern 75 adjacent to the second trench 220 is etched and thus, the side of the third mask pattern 75 adjacent to the second trench 220 is exposed.

Figure 16:
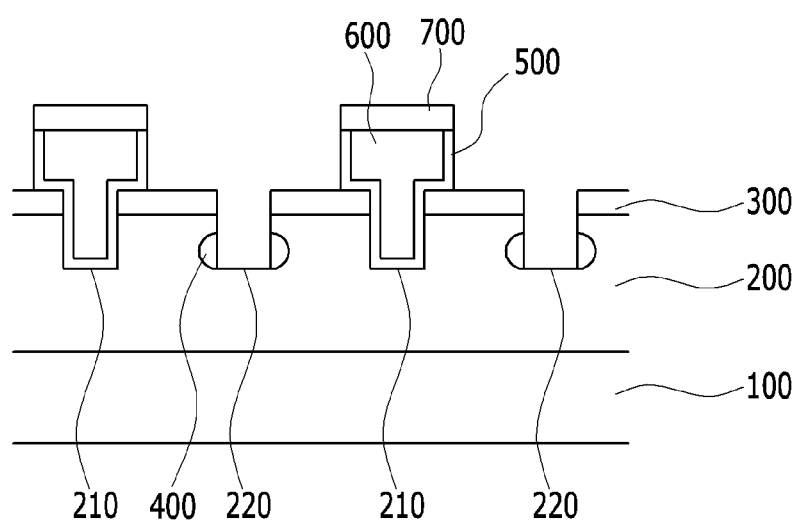

Referring to FIG. 16, the third photosensitive film pattern 90 and the third mask pattern 75 are removed.

When the third mask pattern 75 is removed, an ashing process is performed through the side of the exposed third mask pattern 75. In this case, the second insulating layer 500b and the third insulating layer 700a formed on the third mask pattern 75 are removed. As a result, the gate insulating layer 500 and the passivation layer 700 are formed.

Figure 17:
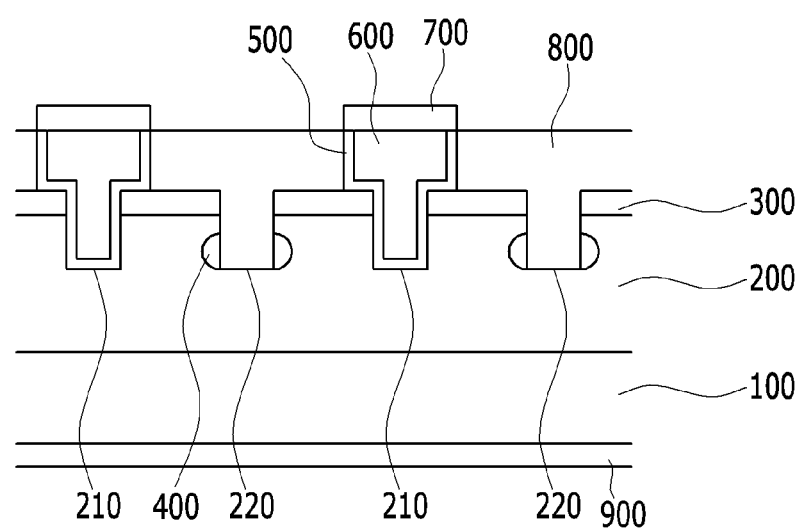

Referring to FIG. 17, a source electrode 800 is formed in the second trench 220, and a drain electrode 900 is formed on a second surface of the n+ type silicon carbide substrate 100. The second surface of the n+ type silicon carbide substrate 100 is positioned at an opposite side to the first surface of the n+ type silicon carbide substrate 100.

In general, since a distance between the first trench 210 and the second trench 220 is very small, in the case where the alignment error is generated when forming the gate insulating layer 500, the gate electrode 600, and the passivation layer 700, accurate etching is not performed. Thus, an insulating material or a gate material remains on the n+ type area 300 adjacent to the first trench 210 and the second trench 220. As a result, there is a problem in that leakage current is generated or a short from the source electrode 800 is generated.

In embodiments of the present disclosure, the second mask pattern 70 is formed on the n+ type area 300, the third mask pattern 75 exposing the part of the n+ type area 300 is formed by etching the second mask pattern 70, and then, the gate electrode 600 is formed, and the gate insulating layer 500 and the passivation layer 700 are formed by removing the third mask pattern 75, and as a result, it is possible to solve the problem due to the alignment error, when forming the gate electrode 600, the gate insulating layer 500, and the passivation layer 700.

While this disclosure has been described in connection with what is presently considered to be practical embodiments, it is to be understood that the disclosure is not limited to the disclosed embodiments, but, on the contrary, is intended to cover various modifications and equivalent arrangements included within the spirit and scope of the appended claims.

DESCRIPTION OF SYMBOLS

50: First mask pattern
55: Groove
60: First photosensitive film pattern
70: Second mask pattern
75: Third mask pattern
80: Second photosensitive film pattern
90: Third photosensitive film pattern
100: Silicon carbide substrate
200: N− type epitaxial layer
210: First trench
220: Second trench
300: N+ type area
400: P type area
500: Gate insulating layer
500a: First insulating layer
500b: Second insulating layer
600: Gate electrode
600a: Gate material layer
700: Passivation layer
700a: Third insulating layer 800: Source electrode
900: Drain electrode

What is claimed is:

1. A method for manufacturing a semiconductor device, the method comprising:
   forming sequentially an n– type epitaxial layer and an n+ type area on a first surface of an n+ type silicon carbide substrate;
   forming a plurality of first trenches and a plurality of second trenches by etching the n– type epitaxial layer and the n+ type area using a first mask pattern as a mask after forming the first mask pattern on the n+ type area;
   forming a groove by etching the first mask pattern using a first photosensitive film pattern as a mask after forming the first photosensitive film pattern in the plurality of first trenches;
   forming a p type area by injecting p ions in the plurality of second trenches using the first mask pattern with the groove as the mask after removing the first photosensitive film pattern;
   forming a gate insulating layer in the plurality of first trenches after removing the first mask pattern with the groove;
   forming a gate electrode on the gate insulating layer;
   forming a passivation layer on the gate electrode;
   forming a source electrode in the plurality of second trenches; and
   forming a drain electrode on a second surface which is an opposite side to the first surface of the n+ type silicon carbide substrate.

2. The method of claim 1, wherein in the forming of the p type area,
   the p ions are injected into a part of the side of each second trench of the plurality of second trenches, and
   the p ions are injected into the part of the side of each second trench in an oblique direction.

3. The method of claim 2, wherein the p type area is formed on the side of each second trench.

4. The method of claim 3, wherein a part of the first photosensitive film pattern is formed on the first mask pattern adjacent to a first trench of the plurality of first trenches.

5. The method of claim 1, wherein the first mask pattern is formed by an oxide film.

6. The method of claim 1, wherein the forming of the gate insulating layer, the forming of the gate electrode, and the forming of the passivation layer include:
   forming a second mask pattern exposing the plurality of first trenches and the plurality of second trenches on the n+ type area after removing the first mask pattern with the groove;
   forming a third mask pattern exposing a part of the n+ type area by etching the second mask pattern;
   forming a first insulating layer on the plurality of first trenches, the plurality of second trenches, the n+ type area, and the third mask pattern;
   forming the second insulating layer exposing the plurality of second trenches and the part of the n+ type area by etching the first insulating layer using a second photosensitive film pattern as a mask after forming the second photosensitive film pattern on the first insulating layer;
   forming a gate material layer on the plurality of second trenches, the n+ type area, and the second insulating layer after removing the second photosensitive film pattern;
   forming a third insulating layer on the gate material layer and the second insulating layer after removing a part of the gate material layer;
   exposing the plurality of second trenches by etching the third insulating layer, the gate material layer, and the second insulating layer using a third photosensitive film pattern as a mask after forming the third photosensitive film pattern on the third insulating layer and forming the gate electrode in the plurality of first trenches; and
   forming the gate insulating layer and the passivation layer by removing the third photosensitive film pattern and the third mask pattern.

7. The method of claim 6, wherein:
   the third mask pattern is removed by an ashing process, and
   the second insulating layer and the third insulating layer formed on the third mask pattern are removed when the third mask pattern is removed.

8. The method of claim 7, wherein the third mask pattern exposes approximately 30% to approximately 50% of the entire surface of the n+ type area.

9. The method of claim 8, wherein the first insulating layer is formed to surround the third mask pattern.

10. The method of claim 9, wherein in the forming of the second insulating layer,
    the plurality of second trenches and the n+ type area at a portion adjacent to a second trench of the plurality of second trenches are exposed by etching the first insulating layer formed in the plurality of second trenches, the first insulating layer formed on the n+ type area at a portion adjacent to the second trench, and a part of the second photosensitive film pattern.

11. The method of claim 10, wherein:
    the third photosensitive film pattern exposes the third insulating layer formed at a portion corresponding to the plurality of second trenches, and
    an extended line of a side of the third photosensitive film pattern coincides with an extended line of a side of the third mask pattern adjacent to the second trench.

12. The method of claim 6, wherein the second mask pattern is formed of amorphous carbon.

13. The method of claim 6, wherein the first insulating layer and the third insulating layer are formed of silicon oxide.

14. The method of claim 6, wherein the gate material layer is formed of polysilicon.

* * * * *